United States Patent [19]
Sanchez

[11] 4,015,211
[45] Mar. 29, 1977

[54] DUAL CHANNEL PULSE WIDTH DETECTOR HAVING DELAY AND D.C. OFFSET MEANS THEREIN

[75] Inventor: Louis A. Sanchez, San Jose, Calif.

[73] Assignee: Itek Corporation, Lexington, Mass.

[22] Filed: Apr. 9, 1976

[21] Appl. No.: 675,391

[52] U.S. Cl. .............................. 329/106; 307/234; 328/112
[51] Int. Cl.² ......................................... H03K 9/08
[58] Field of Search ................... 329/106; 328/112; 307/234

[56] References Cited

UNITED STATES PATENTS

| | | | |
|---|---|---|---|
| 3,413,412 | 11/1968 | Townsend | 328/112 X |
| 3,528,019 | 9/1970 | Inoue | 329/106 |
| 3,571,736 | 3/1971 | West | 329/106 X |

Primary Examiner—Siegfried H. Grimm
Attorney, Agent, or Firm—Homer O. Blair; Robert L. Nathans; Gerald H. Glanzman

[57] ABSTRACT

A first and second channel coupled to a leading edge comparator and a trailing edge comparator is provided wherein pulses having widths to be determined are transmitted to the comparators, the pulses in one channel emanating therefrom being delayed with respect to pulses emanating from the other channel. Biasing circuitry produces an offset bias voltage to change the relative D.C. levels of the pulses, thereby to establish two leading edge crossover points which effect operation of the leading edge comparator and two trailing edge crossover points which effect operation of the trailing edge comparator so that the time differences between pulses produced by the comparators is a measure of the widths of the pulses, regardless of changes in pulse amplitude, D.C. input drift, and changes in duty cycle.

10 Claims, 3 Drawing Figures

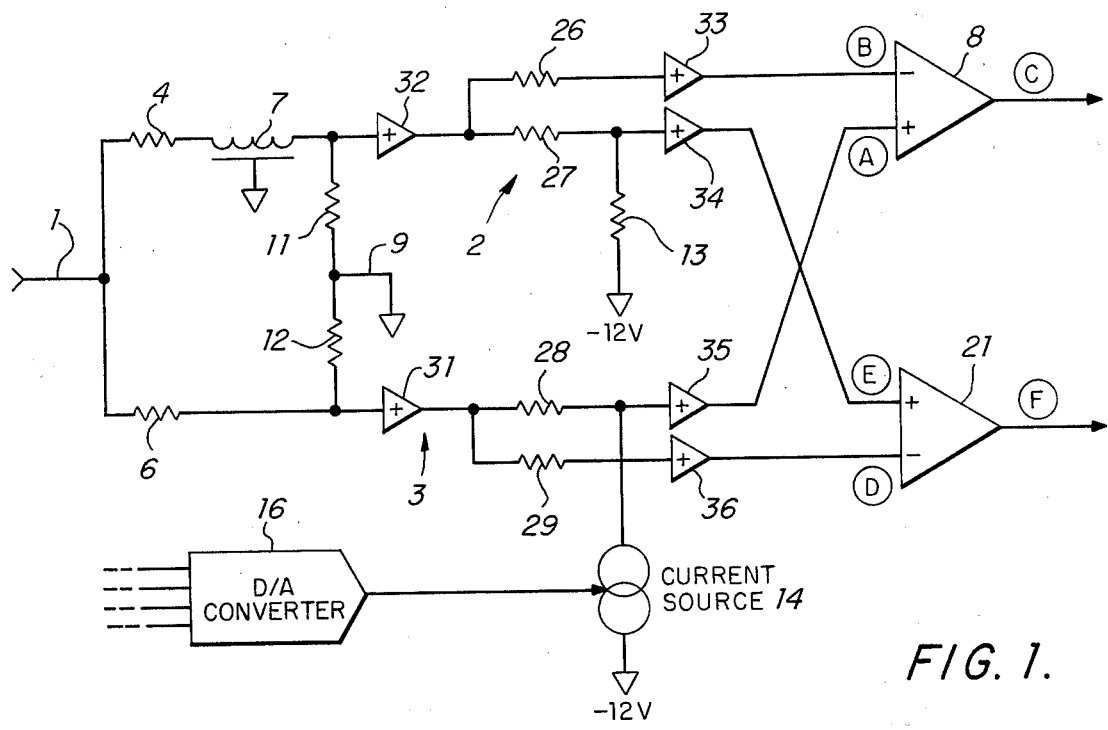
FIG. 1.
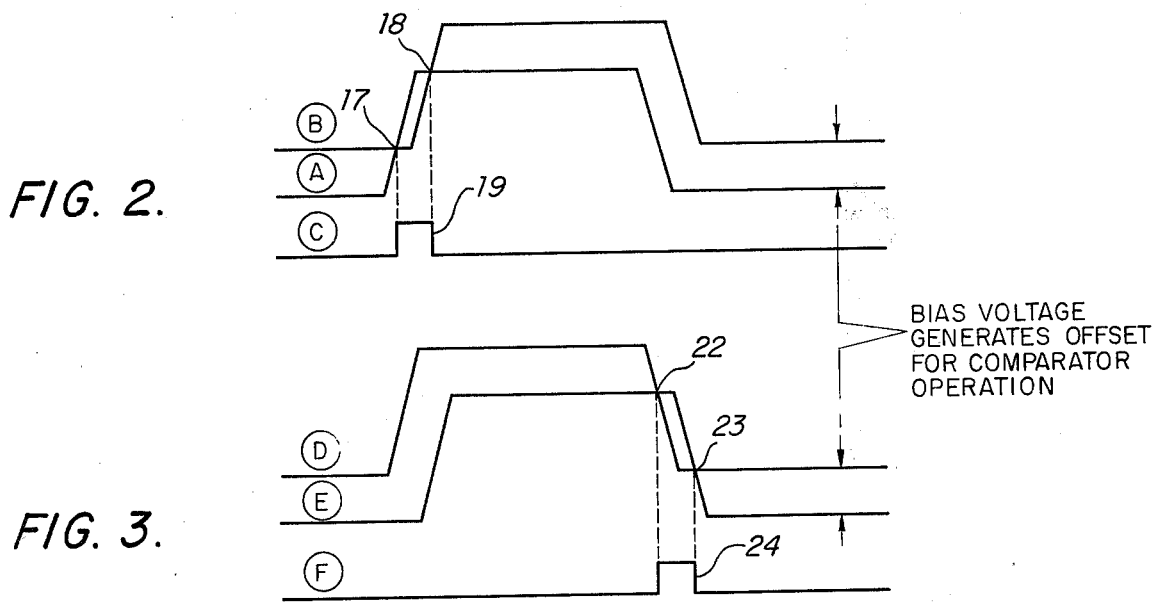
FIG. 2.
FIG. 3.
BIAS VOLTAGE GENERATES OFFSET FOR COMPARATOR OPERATION

DUAL CHANNEL PULSE WIDTH DETECTOR HAVING DELAY AND D.C. OFFSET MEANS THEREIN

BACKGROUND OF THE INVENTION

The present invention relates to the field of pulse width detectors.

Although numerous pulse width detectors are present in the prior art, it is highly desirable to provide an accurate pulse width measuring circuit which produces an accurate measure of input pulse widths independent of distortions and other shifting parameters.

Where compression amplifiers comprising multiple stages coupled in tandem are employed to detect low level input pulses, the resulting output pulses have trailing edge portions which may be described as extended ripples or compression bumps. As the amplitude of the input pulses increase, more amplifier stages go into saturation so that the number of bumps and the widths of the trailing portions of the pulses increase as a function of increasing input pulse amplitudes. Hence, if one were to measure pulse widths at, for example, the halfway point between the baseline and tops of the pulses emanating from the last amplifier stage, the measurements would indicate that the pulse widths increase as a function of amplitude, thereby to produce grossly erroneous pulse width measurements. It is thus highly desirable to provide circuitry for measuring the time difference between the occurrence of the initial portion of the leading edge of the pulse and the occurrence of the initial portion of the trailing edge of the pulse corresponding to the initial degradation in amplitude at the linear portion of the first bump, so as to eliminate any measurement of the variable total degradation time of the trailing edge of the pulse. It is also important to eliminate the effects of input D.C. voltage level drifts of the pulse trains along with the effects of changes in the duty cycle of the pulse trains.

SUMMARY OF THE INVENTION

In the preferred embodiment of the invention, the foregoing objectives are accomplished by providing circuitry which establishes a pair of floating reference levels, the first being associated with the commencement of the leading edge of the input pulse and the second being associated with the initial degradation of the trailing edge of the pulse. The input pulse is introduced into a first and second pulse channel and emanates from the first channel delayed in time with respect to the pulse emanating from the second channel. Additionally, biasing voltages are applied to the channels to generate a relative offset in the D.C. levels of the pulses emanating from the channels, thereby to establish a pair of leading edge crossover points to effect operation of a leading edge pulse comparator coupled to the channels and to additionally establish a pair of trailing edge crossover points to effect the operation of a trailing edge pulse comparator coupled to the channels. The acceptance sensitivity of the detector may be rapidly and accurately decreased by merely increasing the offset bias voltage where it is desired to select only those pulse trains having relatively high amplitudes.

Other objects, features, and advantages of the present invention will become apparent upon the perusal of the following detailed description taken in conjunction with the drawings in which:

FIG. 1 illustrates the preferred embodiment of the invention;

FIG. 2 illustrates the production of the aforesaid leading edge crossover points; and FIG. 3 illustrates the production of the aforesaid trailing edge crossover points.

DETAILED DESCRIPTION

In FIG. 1, input circuit 1 is coupled to a first pulse transmission channel 2 and a second pulse transmission 3 through coupling means comprising resistors 4 and 6 and delay line 7. The input pulse is transmitted to terminal A of the lead edge comparator 8 through the second pulse transmission channel 3 undelayed, and is transmitted to terminal B of comparator 8 through the first channel after a delay interval produced by delay line 7. It is preferred that the channels are center tapped by means of ground terminal 9 coupled to the two channels through 500 ohm resistors 11 and 12 as shown. The abovementioned offset bias voltage is produced by means of resistor 13 coupled to a −12 volt source and current source 14 coupled between the −12 volt source and the second transmission channel 3 as shown. A digital to analog converter 16 is coupled to current source 14 thereby to rapidly and accurately selectively change the biasing voltage, thereby to change the threshold sensitivity as mentioned earlier. The leading edges of the pulses applied to leading edge comparator 8 will be as indicated in FIG. 2. Thus, the application of the delayed, and relatively offset pulses to comparator 8, produce a pair of voltage crossover points 17 and 18, which operate the leading edge comparator to generate output pulse 19. The occurrence of crossover point 17 changes the state of the comparator so that it produces a first output signal—namely, the leading edge of pulse 19, whereas the occurrence of crossover point 18 again changes the state of the comparator to produce a second output signal—namely, the trailing edge of pulse 19. Trailing edge comparator 21 is coupled to the first and second channels as shown and will be actuated by a first trailing edge voltage crossover point 22 and a second voltage crossover point 23 in a similar manner, such crossover points being illustrated in FIG. 3. It may be noted that the leading edge comparator 8 is not actuated by the trailing edge portions applied thereto, and the trailing edge comparator 21 is not actuated by leading edge portions applied thereto, since crossover conditions are not produced as illustrated in FIGS. 2 and 3. Thus, trailing edge crossover points 22 and 23 produce a change in the state of trailing edge comparator 21 to produce a third output signal—namely, the leading edge of pulse 24, and a subsequent change of state to produce a fourth output signal corresponding to crossover point 23—namely, the trailing edge of pulse 24.

It should now be appreciated that the existence of crossover point 22 terminates the measured pulse width interval and corresponds to the occurrence of the initial degradation of the top of the pulse at the first compression bump, thereby to define the above-mentioned trailing edge floating reference point so that the detrimental effect of the slowly deteriorating trailing edges does not affect the measured pulse width. Crossover point 17 corresponds to the initially rising portion of the input pulse to define the first floating reference level.

Let it be assumed that a small amplitude pulse train and a large amplitude pulse train are produced in input circuit 1. If the offset bias voltage is relatively small, the comparators will produce outputs indicative of the pulse widths of the pulses in both trains. Often it is desirable to decrease the sensitivity of the detector so that only large amplitude pulse trains are examined by the detector. This is rapidly and accurately accomplished by altering the digital address of digital to analog converter 16 to increase the offset bias voltage. Under these circumstances, small amplitude pulse trains will not be capable of producing the crossover points since the voltage at terminal A will never exceed the voltage of terminal B, etc.

In a preferred embodiment actually tested, coupling resistors 26, 27, 28, and 29 had a value of 2.2 Kohm whereas resistors 4, 6, 11, and 12 had a resistance of 500 ohm. Delay line 7 had a delay time of 100 nanoseconds. Amplifiers 31, 32, 33, 34, 35, and 36 were unitary gain buffer amplifiers employing 2N 2920 NPN transistors having their emitters resistance coupled to −12 volts, and having their collectors connected to +12 volts.

Numerous variations in the components of the circuitry are envisioned within the scope of the invention as defined by the claims. For example, the first crossover point 17 is defined in certain of the following claims as occurring when the amplitude of the leading edge of the undelayed pulse "exceeds" the amplitude of the delayed pulse. The term "exceeds" is intended to encompass the case where the voltage of the undelayed pulse becomes more negative than the voltage of the delayed pulse rather than becoming more positive as illustrated in the figures, etc. The pulses may all be negative going rather than positive going within the scope of the invention. The detector may be modified to merely produce one output signal corresponding to one leading edge crossover point and a second signal corresponding to one trailing edge crossover point to effect pulse width measurement with scope of all of the following claims.

While a preferred embodiment of the invention has been described, the teachings of the invention will readily suggest many other embodiments to those skilled in the art.

What is claimed is:

1. A pulse width detector comprising:
   a. an input circuit;
   b. first and second pulse transmission means coupled to said input circuit, said first transmission means including a delay means therein for delaying pulses emanating from said first channel with respect to pulses emanating from said second channel;
   c. offsetting means coupled to at least one of said channels for producing a relative shift between the D.C. levels of said pulses emanating from said channels;
   d. first comparator means coupled to said first and second channels for detecting the voltage crossover points of the leading edges of the pulses emanating from said first and second pulse transmission means; and
   e. second voltage comparator means coupled to said first and second channels for detecting the voltage crossover points of the trailing edges of the pulses emanating from said first and second pulse transmission means.

2. The combination as set forth in claim 1 wherein said offsetting means is adjustable to alter the threshold sensitivity of said detector.

3. The combination as set forth in claim 1 wherein said offsetting means comprises a first biasing means coupled to one channel and a second biasing means coupled to the other channel which produces a different bias of said other channel with respect to said one channel.

4. The offsetting means as set forth in claim 3 wherein said second biasing means includes a current source.

5. The combination as set forth in claim 2 further including a digital to analog converter coupled to said offsetting means for precisely and rapidly varying the bias applied by said offsetting means.

6. The combination as set forth in claim 3 further including a digital to analog converter coupled to at least one of said biasing means for varying the applied bias thereby to precisely and rapidly alter the threshold sensitivity of said detector.

7. The combination as set forth in claim 4 further including a digital to analog converter coupled to said current source for varying the applied bias thereby to precisely and rapidly alter the threshold sensitivity of said detector.

8. A pulse width detector comprising:
   a. an input circuit for receiving pulses having widths to be measured;
   b. a first and second pulse transmission channel;
   c. coupling means coupled between said input circuit and said first and second pulse transmission channel for conveying said pulses to said first and second channels wherein the pulses introduced into said first channel are delayed with respect to the pulses introduced into said second channel by a delay means within said coupling means;
   d. offsetting means for shifting the relative D.C. levels of the pulses emanating from said first and second channels;
   e. a leading edge pulse comparator coupled to the output circuits of said first and second channels for producing a first signal when the amplitude of the leading edge of the undelayed pulse in said second channel exceeds the amplitude of the delayed pulse in said first channel and for producing a second signal when the amplitude of the leading edge of the delayed pulse in said first channel exceeds the amplitude of the pulse in said second channel; and
   f. a trailing edge pulse comparator coupled to said first and second channels for producing a third signal when the amplitude of the pulse in said second channel becomes less than the amplitude of the delayed pulse in said first channel and which produces a fourth signal when the amplitude of the delayed pulse in said first channel becomes less than the amplitude of the pulse in said second channel.

9. The combination as set forth in claim 8 wherein said offsetting means comprises biasing means coupled to at least one of said channels.

10. The combination as set forth in claim 9 further including adjustment means for varying the setting of said biasing means to alter the relative degree of offset between the pulses passing through said first and second channel, thereby to alter the pulse amplitude threshold sensitivity of said detector.

* * * * *